US010355055B2

(12) United States Patent
Fujiwara et al.

(10) Patent No.: US 10,355,055 B2
(45) Date of Patent: Jul. 16, 2019

(54) ORGANIC EL DISPLAY DEVICE

(71) Applicant: Sharp Kabushiki Kaisha, Sakai, Osaka (JP)

(72) Inventors: Seiji Fujiwara, Sakai (JP); Takeshi Hirase, Sakai (JP); Tetsuya Okamoto, Sakai (JP); Tohru Senoo, Sakai (JP); Tohru Sonoda, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 244 days.

(21) Appl. No.: 15/524,442

(22) PCT Filed: Nov. 4, 2015

(86) PCT No.: PCT/JP2015/081020
§ 371 (c)(1),
(2) Date: May 4, 2017

(87) PCT Pub. No.: WO2016/076169
PCT Pub. Date: May 19, 2016

(65) Prior Publication Data
US 2018/0277609 A1 Sep. 27, 2018

(30) Foreign Application Priority Data

Nov. 10, 2014 (JP) ................. 2014-228400

(51) Int. Cl.
H01L 27/32 (2006.01)
G02B 5/20 (2006.01)
(Continued)

(52) U.S. Cl.
CPC .............. *H01L 27/322* (2013.01); *G02B 5/20* (2013.01); *H01L 27/326* (2013.01);
(Continued)

(58) Field of Classification Search
None
See application file for complete search history.

(56) References Cited

U.S. PATENT DOCUMENTS

2005/0221121 A1* 10/2005 Ishihara .............. H01L 51/5036
428/690
2009/0261715 A1* 10/2009 Sung ................... H01L 27/3213
313/504
(Continued)

FOREIGN PATENT DOCUMENTS

JP   H11-67457 A   3/1999
JP   2008-34591 A   2/2008
(Continued)

Primary Examiner — Michelle Mandala
(74) Attorney, Agent, or Firm — ScienBiziP, P.C.

(57) ABSTRACT

This organic EL display device is provided with: a TFT substrate; a counter substrate; an organic EL element provided on the TFT substrate; a sealing film that seals the organic EL element; a color filter layer provided on the counter substrate on a side closer to the organic EL element; and a filler layer that is filled between the sealing film and the color filter layer. This organic EL display device satisfies $nM(h-1)/nMh \times LM(h-1)/\sqrt{(TM(h-1)^2+LM(h-1)^2)} \geq 1$, $nMh/ng \times LMh/\sqrt{(TMh^2+LMh^2)} \geq 1$, $ng/nCF \times Lg/\sqrt{(Tg^2+Lg^2)} \geq 1$, $nCF/nGL \times LCF/\sqrt{(TCF^2+LCF^2)} \geq 1$, or $nGL/nair \times LGL/\sqrt{(TGL^2+LGL^2)} \geq 1$, while satisfying $XEC/2+XBM/2 \geq \Sigma(TMi \times \tan\theta Mi)+Tg \times \tan\theta g+TCF \times \tan\theta CF$.

12 Claims, 7 Drawing Sheets

(51) Int. Cl.
    *H01L 51/00*  (2006.01)
    *H01L 51/52*  (2006.01)
(52) U.S. Cl.
    CPC ...... *H01L 27/3262* (2013.01); *H01L 51/0096* (2013.01); *H01L 51/524* (2013.01); *H01L 51/5218* (2013.01); *H01L 51/5234* (2013.01); *H01L 51/5256* (2013.01); *H01L 51/5275* (2013.01); *H01L 51/5284* (2013.01); *H01L 2251/5315* (2013.01)

(56) References Cited

U.S. PATENT DOCUMENTS

| 2010/0187986 | A1 | 7/2010 | Kajitani et al. |
| 2014/0138716 | A1* | 5/2014 | Satou .................. H01L 27/15 257/88 |

FOREIGN PATENT DOCUMENTS

| JP | 2009-037812 A | 2/2009 |
| JP | 2010-225325 A | 10/2010 |
| JP | 2014-102371 A | 6/2014 |

* cited by examiner

ORGANIC EL DISPLAY DEVICE

TECHNICAL FIELD

The present disclosure relates to an organic EL display device including an organic EL (electroluminescence) element.

BACKGROUND ART

In recent years, flat panel displays have been utilized in various products and fields, and there is demand for flat panel displays having larger sizes, higher picture quality, and lower power consumption.

In view of such circumstances, organic electroluminescent (EL) display devices provided with organic EL elements utilizing the electroluminescence of organic materials are attracting much attention as flat panel displays due to their excellent qualities, such as low voltage driving, high responsiveness, and self-luminosity, while being in a completely solid state.

For example, in an active matrix organic EL display device, a thin film organic EL element is provided on a substrate on which a thin film transistors (TFT) is provided. In an organic EL element, an organic EL layer including a light-emitting layer is layered between a pair of electrodes. One of the pair of electrodes is connected to the TFT. An image display is performed by applying a voltage between the pair of electrodes and causing the light-emitting layer to emit light.

In organic EL display devices as described above, RGB sub pixels that emit red (R), green (G), and blue (B) light are provided to display color images.

Furthermore, in organic EL display devices as described above, the color reproducibility of red, green, and blue light is unproved by providing a color filter layer on a counter substrate opposing the substrate, for example.

In conventional organic EL display devices described above, a configuration has been proposed in which a sealing film having an organic layer and an inorganic layer layered in an alternating manner is provided on an organic EL element, as disclosed in the following PTL 1, for example. According to this conventional organic EL display device, the sealing film makes it possible to prevent the organic EL element from degrading due to moisture or oxygen and improve the reliability of the device.

CITATION LIST

Patent Literature

PTL 1: Japanese Unexamined Patent Application Publication No. 2009-37812A

SUMMARY

Technical Problem

However, the conventional organic EL display devices as described above have a problem in that either of R, G, or B light enters into adjacent sub pixels (pixels) such that colors mix together, causing a drop in light emission quality and a corresponding drop in display quality.

More specifically, providing the sealing film in the conventional organic EL display device results in a greater dimension (gap) from the interface between the organic EL element and the sealing film to the color filter layer. This makes it easier for the light emitted from a given sub pixel to enter adjacent sub pixels, and thus, it is more likely that the colors will mix together. As a result, such conventional organic EL display devices have had a problem of reduced light emission quality and a corresponding drop in display quality.

In light of the problems described above, an object of the present disclosure is to provide an organic EL display device that can prevent a drop in display quality and is thus, highly-reliable even when a sealing film is provided.

Solution to Problem

To achieve the object described above, an organic EL display device according to an aspect of the present invention includes:

a substrate;

an organic EL element provided on the substrate, the organic EL element including a plurality of pixels, the organic EL element including:

a first electrode, the first electrode being provided for each of the plurality of pixels and constituted of a reflective electrode; and an edge cover including an opening, the opening being provided exposing the first electrode and defining a light-emitting region of each of the plurality of pixels;

a sealing film including h, where h is an integer of 3 or greater, sealing layers layered with each other, the sealing film sealing the organic EL element;

a counter substrate opposing the substrate;

a black matrix provided on the counter substrate on a side closer to the organic EL element, the black matrix corresponding to the plurality of pixels;

a color filter layer provided covering the black matrix, the color filter layer corresponding to the plurality of pixels; and a filling layer filled between the sealing film and the color filter layer, wherein when a refractive index of an hth sealing layer from the substrate is represented by $nMh$, a refractive index of the filling layer is represented by $ng$, a refractive index of the color filter layer is represented by $nCF$, and a refractive index of the counter substrate is represented by $nGL$, a dimension of the hth sealing layer in a direction perpendicular to a surface of the substrate is represented by $TMh$, a dimension of an (h−1)th sealing layer from the substrate in the direction perpendicular to the surface of the substrate is represented by $TM(h-1)$, a dimension of the filling layer in the direction perpendicular to the surface of the substrate is represented by $Tg$, a dimension of the color filter layer in the direction perpendicular to the surface of the substrate is represented by $TCF$, and a dimension of the counter substrate in the direction perpendicular to the surface of the substrate is represented by $TGL$, and a refractive index of the (h−1)th sealing layer is represented by $nM(h-1)$, a refractive index of an (h−2)th sealing layer from the substrate is represented by $nM(h-2)$, an incident angle of light on the (h−1)th sealing layer is represented by $\theta M(h-1)$, and an incident angle of light on the (h−2)th sealing layer is represented by $\theta M(h-2)$, a dimension of the (h−1)th sealing layer in a direction parallel to the surface of the substrate is represented by $LM(h-1)$, $LM(h-1)$ being found through Equations (a) and (b), $$LM(h-1) = TM(h-1) \times \tan \theta M(h-1) \quad (a)$$

$$\theta M(h-1) = \arcsin\{(nM(h-2)/nM(h-1)) \times \sin \theta M(h-2)\} \quad (b),$$

when an incident angle of light on the hth sealing layer is represented by $\theta Mh$, a dimension of the hth sealing layer in the direction parallel to the surface of the substrate is represented by LMh, LMh being found through Equations (c) and (d), $$LMh = TMh \times \tan \theta Mh \quad (c)$$

$$\theta Mh = \arcsin\{(nM(h-1)/nMh) \times \sin \theta M(h-1)\} \quad (d),$$

when an incident angle of light on the filling layer is represented by θg, a dimension of the filling layer in the direction parallel to the surface of the substrate is represented by Lg, Lg being found through Equations (e) and (f), $$Lg = Tg \times \tan \theta g \quad (e)$$

$$\theta g = \arcsin\{(nMh/ng) \times \sin \theta Mh\} \quad (f),$$

when an incident angle of light on the color filter layer is represented by θCF, a dimension of the color filter layer in the direction parallel to the surface of the substrate is represented by LCF, LCF being found through Equations (g) and (h), $$LCF = TCF \times \tan \theta CF \quad (g)$$

$$\theta CF = \arcsin\{(ng/nCF) \times \sin \theta g\} \quad (h),$$

when an incident angle of light on the counter substrate is represented by θGL, a dimension of the counter substrate in the direction parallel to the surface of the substrate is represented by LGL, LGL being found through Equations (i) and (j), $$LGL = TGL \times \tan \theta GL \quad (i)$$

$$\theta GL = \arcsin\{(nCF/nGL) \times \sin \theta CF\} \quad (j),$$

any one of Relationships (1) to (5), the relationships being conditions for total reflection, are satisfied, $$nM(h-1)/nMh \times LM(h-1)/\sqrt{(TM(h-1)^2 + LM(h-1)^2)} \geq 1 \quad (1)$$

$$nMh/ng \times LMh/\sqrt{(TMh^2 + LMh^2)} \geq 1 \quad (2)$$

$$ng/nCF \times Lg/\sqrt{(Tg^2 + Lg^2)} \geq 1 \quad (3)$$

$$nCF/nGL \times LCF/\sqrt{(TCF^2 + LCF^2)} \geq 1 \quad (4)$$

$$nGL/nair \times LGL/\sqrt{(TGL^2 + LGL^2)} \geq 1 \quad (5),$$

the black matrix and the edge cover are provided with a center of the black matrix and a center of the edge cover matching each other in the direction parallel to the surface of the substrate, and when a width dimension of the black matrix in the direction parallel to the surface of the substrate is represented by XBM and a width dimension of the edge cover in the direction parallel to the surface of the substrate is represented by XEC, a dimension, in the direction perpendicular to the surface of the substrate, of an ith, where i is an integer of 1 or greater, sealing layer, among the h sealing layers, from the substrate, is represented by TMi, and an incident angle of light on the ith sealing layer is represented by θMi, Relationship (6) is satisfied, $$XEC/2 + XBM/2 \geq \Sigma(TMi \times \tan \theta Mi) + Tg \times \tan \theta g + TCF \times \tan \theta CF \quad (6).$$

The organic EL display device configured as described above satisfies one of the above-described Relationships (1) to (5), which are conditions for total reflection. Thus, in the organic EL display device, when light is incident on the first sealing layer from the substrate at an angle greater than or equal to the minimum incident angle, at which the angle of light emitted toward the atmosphere from the counter substrate exceeds a value of 90°, the light emitted from the plurality of pixels in the organic EL element described above is totally reflected toward the substrate at one of the substrate-side surface of the above-described hth sealing layer, the substrate-side surface of the filling layer, the substrate-side surface of the color filter layer, the substrate-side surface of the counter substrate, and the atmosphere-side surface of the counter substrate. Additionally, when light is incident on the first sealing layer at an angle less than the minimum incident angle described above (that is, at an angle less than the minimum light leakage incident angle at which light leaks into adjacent sub pixels), the above-described Relationship (6) is satisfied, and thus, the incident light is incident only on the corresponding color filter layer or the black matrix. Thus, light emitted from a (sub) pixel can be prevented from entering a pixel adjacent to that pixel, and color mixing can be prevented, unlike in the conventional example described above. As a result, unlike the conventional example described above, an organic EL display device can be configured that can prevent a drop in display quality and is thus, highly-reliable even when a sealing film is provided.

Additionally, an organic EL display device according to an aspect of the present invention includes:

a substrate;

an organic EL element provided on the substrate, the organic EL element including a plurality of pixels, the organic EL element including:

a first electrode, the first electrode being provided for each of the plurality of pixels and constituted of reflecting electrodes; and an edge cover including an opening, the opening being provided exposing the first electrode and defining a light-emitting region of each of the plurality of pixels;

a sealing film including h, where h is an integer or 1 or greater, sealing layers layered with each other, the sealing film sealing the organic EL element;

a counter substrate opposing the substrate;

a black matrix provided on the counter substrate on a side closer to the organic EL element, the black matrix corresponding to the plurality of pixels;

a color filter layer provided covering the black matrix, the color filter layer corresponding to the plurality of pixels; and a filling layer filled between the sealing film and the color filter layer, wherein when a refractive index of an hth sealing layer from the substrate is represented by nMh, a refractive index of the filling layer is represented by ng, a refractive index of the color filter layer is represented by nCF, and a refractive index of the counter substrate is represented by nGL, a dimension of the filling layer in a direction perpendicular to a surface of the substrate is represented by Tg, a dimension of the color filter layer in the direction perpendicular to the surface of the substrate is represented by TCF, and a dimension of the counter substrate in the direction perpendicular to the surface of the substrate is represented by TGL, an incident angle of light on the hth sealing layer is represented by θMh and an incident angle of light on the filling layer is represented by θg, a dimension of the filling layer in a direction parallel to the surface of the substrate is represented by Lg, Lg being found through the following Equations (e) and (f), $$Lg = Tg \times \tan \theta g \quad (e)$$

$$\theta g = \arcsin\{(nMh/ng) \times \sin \theta Mh\} \quad (f),$$

when an incident angle of light on the color filter layer is represented by θCF, a dimension of the color filter layer in the direction parallel to the surface of the substrate is represented by LCF, LCF being found through the following Equations (g) and (h), $$LCF = TCF \times \tan \theta CF \quad (g)$$

$$\theta CF = \arcsin\{(ng/nCF) \times \sin \theta g\} \quad (h),$$

when an incident angle of light on the counter substrate is represented by θGL, a dimension of the counter substrate in the direction parallel to the surface of the substrate is represented by LGL, LGL being found through the following Equations (i) and (j), $$LGL = TGL \times \tan \theta GL \quad (i)$$

$$\theta GL = \arcsin\{(nCF/nGL) \times \sin \theta CF\} \quad (j),$$

any one of the following Relationships (3) to (5), the relationships being conditions for total reflection, is satisfied, $$ng/nCF \times Lg/\sqrt{(Tg^2 + Lg^2)} \geq 1 \quad (3)$$

$$nCF/nGL \times LCF/\sqrt{(TCF^2 + LCF^2)} \geq 1 \quad (4)$$

$$nGL/nair \times LGL/\sqrt{(TGL^2 + LGL^2)} \geq 1 \quad (5),$$

the black matrix and the edge cover are provided with a center of the black matrix and a center of the edge cover matching each other in the direction parallel to the surface of the substrate, and when a width dimension of the black matrix in the direction parallel to the surface of the substrate is represented by XBM and a width dimension of the edge cover in the direction parallel to the surface of the substrate is represented by XEC, a dimension, in the direction perpendicular to the surface of the substrate, of an ith, where i is an integer of 1 or greater, sealing layer, among the h sealing layers, from the substrate, is represented by TMi, and an incident angle of light on the ith sealing layer is represented by θMi, the following Relationship (6) is satisfied.

$$XEC/2 + XBM/2 \geq \Sigma(TMi \times \tan \theta Mi) + Tg \times \tan \theta g + TCF \times \tan \theta CF \quad (6).$$

The organic EL display device configured as described above satisfies one of the above-described Relationships (3) to (5), which are conditions for total reflection. Thus, in the organic EL display device, when light is incident on the first sealing layer from the substrate at an angle greater than or equal to the minimum incident angle, at which the angle of light emitted toward the atmosphere from the counter substrate exceeds a value of 90°, the light emitted from the plurality of pixels in the organic EL element described above is totally reflected toward the substrate at any one of the substrate-side surface of the color filter layer, the substrate-side surface of the counter substrate, and the atmosphere-side surface of the counter substrate. Additionally, when light is incident on the first sealing layer at an angle less than the minimum incident angle described above (that is, at an angle less than the minimum light leakage incident angle at which light leaks into adjacent sub pixels), the above-described Relationship (6) is satisfied, and thus, the incident light is incident only on the corresponding color filter layer or the black matrix. Thus, light emitted from a (sub) pixel can be prevented from entering a pixel adjacent to that pixel, and color mixing can be prevented, unlike in the conventional example described above. As a result, unlike the conventional example described above, an organic EL display device can be configured that can prevent a drop in display quality and is thus, highly-reliable even when a sealing film is provided.

Additionally, an organic EL display device according to an aspect of the present invention includes:

a substrate;

an organic EL element provided on the substrate, the organic EL element including a plurality of pixels, the organic EL element including:

a first electrode, the first electrode being provided for each of the plurality of pixels and constituted of a reflective electrode; and an edge cover including an opening, the opening being provided exposing the first electrode and defining a light-emitting region of each of the plurality of pixels;

a sealing film including h, where h is an integer or 1 or greater, sealing layers layered with each other, the sealing film sealing the organic EL element;

a counter substrate opposing the substrate;

a black matrix provided on the counter substrate on a side closer to the organic EL element, the black matrix corresponding to the plurality of pixels;

a color filter layer provided covering the black matrix, the color filter layer corresponding to the plurality of pixels; and a filling layer filled between the sealing film and the color filter layer, wherein when a refractive index of an hth sealing layer from the substrate is represented by nMh, a refractive index of the filling layer is represented by ng, and a refractive index of the color filter layer is represented by nCF, a dimension of the filling layer in a direction perpendicular to a surface of the substrate is represented by Tg, and a dimension of the color filter layer in the direction perpendicular to the surface of the substrate is represented by TCF, an incident angle of light on the hth sealing layer is represented by θMh and an incident angle of light on the filling layer is represented by θg, a dimension of the filling layer in a direction parallel to the surface of the substrate is represented by Lg, Lg being found through the following Equations (e) and (f), $$Lg = Tg \times \tan \theta g \quad (e)$$

$$\theta g = \arcsin\{(nMh/ng) \times \sin \theta Mh\} \quad (f),$$

when an incident angle of light on the color filter layer is represented by θCF, a dimension of the color filter layer in the direction parallel to the surface of the substrate is represented by LCF, LCF being found through the following Equations (g) and (h), $$LCF = TCF \times \tan \theta CF \quad (g)$$

$$\theta CF = \arcsin\{(ng/nCF) \times \sin \theta g\} \quad (h),$$

the black matrix and the edge cover are provided with a center of the black matrix and a center of the edge cover matching each other in the direction parallel to the surface of the substrate, when a width dimension of the black matrix in the direction parallel to the surface of the substrate is represented by XBM and a width dimension of the edge cover in the direction parallel to the surface of the substrate is represented by XEC, a dimension, in the direction perpendicular to the surface of the substrate, of an ith, where i is an integer of 1 or greater, sealing layer, among the h sealing layers, from the substrate, is represented by TMi, and an incident angle of light on the ith sealing layer is represented by θMi, the following Relationship (6) is satisfied, $$XEC/2 + XBM/2 \geq \Sigma(TMi \times \tan \theta Mi) + Tg \times \tan \theta g + TCF \times \tan \theta CF \quad (6),$$

when, at the incident angle of light from the substrate incident on the first sealing layer of the h sealing layers, a minimum light leakage incident angle at which light leaks to an adjacent sub pixel is represented by θlim, the following Equation (o) holds true, $$XEC/2+XBM/2=TM1\times\tan\theta lim+TM2\times\tan\theta M2+\ldots+TMh\times\tan\theta Mh+Tg\times\tan\theta g\times TCF\times\tan\theta CF \quad (o),$$

and when an angle of the opening in the edge cover is represented by θEC, the angle θEC is set to an angle greater than (90°−θlim).

In the organic EL display device configured as described above, the above-described Relationship (6) is satisfied. Thus, when light is incident on the first sealing layer from the substrate relative to the first sealing layer at an angle less than the minimum incident angle (that is, at an angle less than the minimum light leakage incident angle at which light leaks into adjacent sub pixels), such that the angle of light emitted toward the atmosphere from the counter substrate is a value exceeding 90°, the above-described Relationship (6) is satisfied, and thus, the incident light is incident only on the corresponding color filter layer or the black matrix. Additionally, the angle θEC at the openings in the edge cover is set to an angle greater than (90°−θlim), and thus, light is prevented from being incident on the first sealing layer at an angle greater than or equal to the minimum incident angle described above. Thus, light emitted from a (sub) pixel can be prevented from entering a pixel adjacent to that pixel, and color mixing can be prevented, unlike in the conventional example described above. As a result, unlike the conventional example described above, an organic EL display device can be configured that can prevent a drop in display quality and is thus, highly-reliable even when a sealing film is provided. Additionally, the angle θEC described above is set to an angle greater than (90°−θlim), and thus, at least one of the width dimension XBM of the black matrix and the width dimension XEC of the edge cover can be reduced. As a result, the pixel aperture ratio can be increased.

In the organic EL display device described above, the h sealing layers may be constituted of h inorganic films.

In this case, a sealing film having a superior sealing function can be formed with ease.

Additionally, in the organic EL display device described above, the h sealing layers may be constituted of a layered structure of an inorganic film and an organic film.

In this case, a low-stress structure suitable for achieving flexibility can be provided while ensuring a superior sealing function.

Additionally, in the organic EL display device described above, a film-type filling material may be used in the filling layer.

In this case, an organic EL display device having a simple structure and low number of components can be configured with ease.

Additionally, in the organic EL display device described above, a liquid filling material may be used in the filling layer; and a sealing member having a frame shape may be provided between the substrate and the counter substrate and surround the black matrix, the color filter layer, the filling layer, the sealing film, and the organic EL element.

In this case, the sealing properties for the organic EL element can be improved with ease, and an organic EL display device having superior reliability can be configured with ease.

Additionally, in the organic EL display device described above, the organic EL element may include a white light-emitting layer that emits white light.

In this case, an organic EL display device having a simple structure can be configured with ease.

Additionally, in the organic EL display device described above, the organic EL element may include red, green, and blue light-emitting layers that emit red, green, and blue light, respectively.

In this case, an organic EL display device having superior display quality can be configured with ease.

Advantageous Effects of Invention

According to the embodiment of the invention, an organic EL display device can be provided that can prevent a drop in display quality and is thus, highly-reliable even when a sealing film is provided.

DESCRIPTION OF EMBODIMENTS

Figure 1:
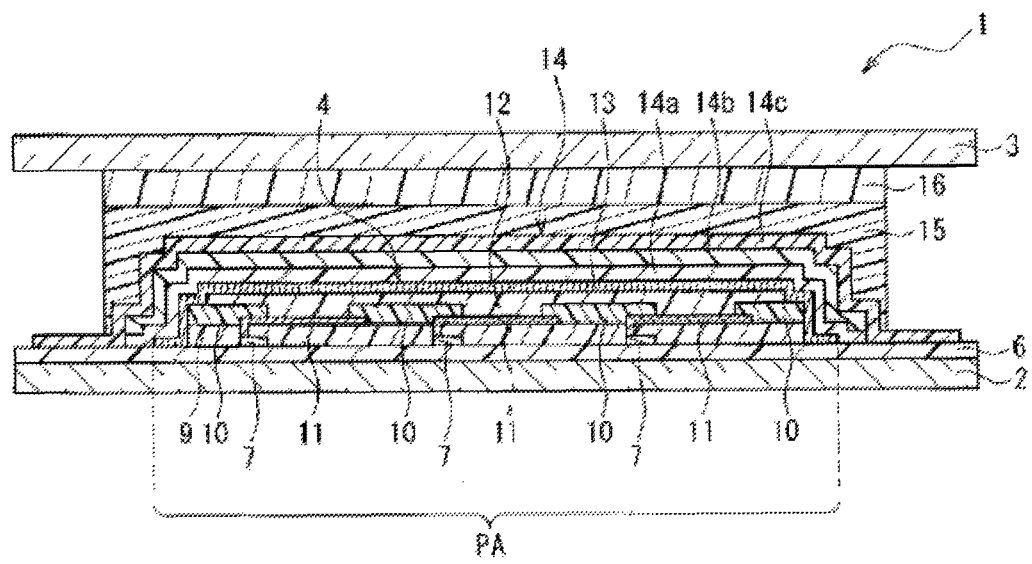
FIG. 1 is a cross-sectional view illustrating a cross-section of an organic EL display device according to a first embodiment of the present invention.

Preferred embodiments of an organic EL display device according to the present invention will be described hereinafter with reference to the drawings. Note that the dimensions of the constituent members illustrated in the drawings are not intended to accurately represent the actual dimensions of the constituent members, the ratios of dimensions between the constituent members, and the like.

First Embodiment

Figure 2:
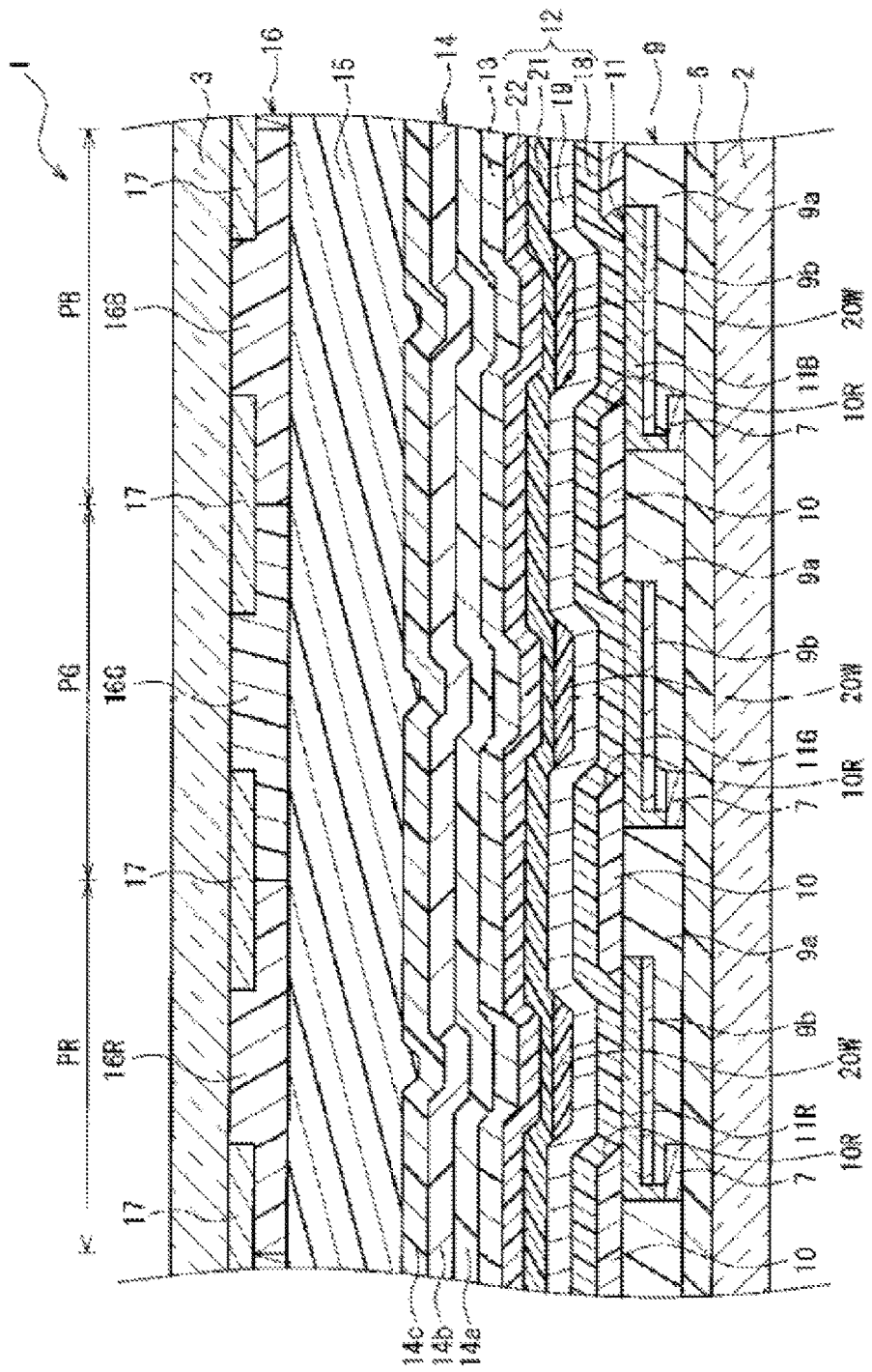
FIG. 2 is an enlarged cross-sectional view illustrating a configuration of main parts of the organic EL display device described above.

FIG. 1 is a cross-sectional view illustrating a cross-section of an organic EL display device according to a first embodiment of the present invention. FIG. 2 is an enlarged plan view illustrating a configuration of main parts of the organic EL display device described above. As illustrated in FIG. 1, an organic EL display device 1 according to the present embodiment includes a TFT substrate 2 serving as a substrate, and an organic EL element 4, serving as an electroluminescence element, provided on the TFT substrate 2.

In the organic EL display device 1 according to the present embodiment, the organic EL element 4 constitutes a rectangular pixel area PA having a plurality of pixels (including a plurality of sub pixels). The organic EL element 4 is sealed by a sealing film 14 having h layers (where h is an integer greater than or equal to 3), for example, three layers. In other words, the sealing film 14 has a first sealing layer 14a, a second sealing layer 14b, and a third sealing layer 14c. The pixel area PA constitutes a display portion of the organic EL display device 1 that displays information. In other words, a plurality of pixels (a plurality of sub pixels), which will be described later, are arranged in a matrix in this pixel area PA, and the organic EL element 4 is configured to display information by emitting light from each of the sub pixels. RGB sub pixels that emit red (R), green (G), and blue (B) light, for example, are provided as the plurality of sub pixels (details will be given later).

In the organic EL display device 1 according to the present embodiment, a counter substrate 3 is provided opposing the TFT substrate 2. A color filter layer 16 is provided on a surface of the counter substrate 3 on a side closer to the organic EL element 4. Additionally, a filling layer 15 is filled between the sealing film 14 described above and the color filter layer 16.

The TFT substrate 2 illustrated in FIG. 1 is constituted by, for example, a glass material, a flexible (bendable) film, or the like. A foundation film (insulating film) 6 is provided covering the entire surface of the TFT substrate 2. Furthermore, as illustrated in FIG. 1, in the organic EL display device 1, a thin film transistor (TFT) 7 is provided on the foundation film 6 for each sub pixel in the pixel area PA. Additionally, wires including a plurality of source lines (signal lines) and a plurality of gate lines arranged in a matrix (not illustrated) are formed on the foundation film 6. A source driver and a gate driver (not illustrated) are connected to each of the source lines and the gate lines, respectively, and the TFT 7 of each of the sub pixels is driven in response to image signals inputted from the exterior. Each TFT 7 functions as a switching element that controls the emission of light from the corresponding sub pixel, and controls the emission of light from a red (R), green (G), or blue (B) sub pixel.

Note that the foundation film 6 serves to prevent the characteristics of the TFTs 7 from degrading due to impurities diffusion into the TFTs 7 from the TFT substrate 2, and thus, may be omitted when this type of deterioration is not a matter for concern.

Additionally, when the TFT substrate 2 is a flexible film, a moisture-proof layer constituted of an inorganic film such as silicon nitride or silicon oxynitride may be formed in advance on the TFT substrate 2 in order to prevent moisture or oxygen from penetrating (permeating) from the exterior and causing the TFTs 7 or the organic EL element 4 to degrade.

Meanwhile, a glass material or a flexible (bendable) film, for example, is used for the counter substrate 3, in the same manner as the TFT substrate 2.

Additionally, as illustrated in FIG. 1, an interlayer insulating film 9, an edge cover 10, and first electrodes 11 of the organic EL element 4 are formed on the TFT substrate 2. The interlayer insulating film 9 functions as a leveled film, and is provided on the foundation film 6 covering the TFTs 7 and the wires. The edge cover 10 is formed on the interlayer insulating film 9 covering a pattern end portion of the first electrode 11. The edge cover 10 also functions as an insulating layer for preventing a short circuit between the first electrodes 11 and a second electrode 13 (described later). The first electrode 11 is connected to the TFT 7 via a contact hole formed in the interlayer insulating film 9.

Openings in the edge cover 10, that is, parts where the first electrodes 11 are exposed, substantially constitute light-emitting regions of the organic EL element 4, and as described above, the organic EL display device 1 according to the present embodiment is configured such that R, G, or B light is emitted from the openings to produce a full-color display. Additionally, the organic EL display device 1 according to the present embodiment is configured as an active matrix display device having the thin film transistors (TFTs) 7.

As illustrated in FIG. 1, an organic EL layer 12 and the second electrode 13 are formed on the first electrodes 11, and the first electrodes 11, the organic EL layer 12, and the second electrode 13 constitute the organic EL element 4. In other words, the organic EL element 4 is, for example, a light-emitting element capable of emitting light at high luminance through low-voltage DC driving, and includes the first electrodes 11, the organic EL layer 12, and the second electrode 13.

More specifically, when the first electrodes 11 serve as positive electrodes, a hole injecting layer 18, a hole transport layer 19, a light-emitting layer 20W, an electron transport layer 21, and an electron injecting layer 22 are layered in that order from the first electrode 11 as the organic EL layer 12, and also the second electrode 13 serving as a negative electrode is formed, as illustrated in FIG. 2. Alternatively, the configuration may be such that a single layer has two or more functions, such as functioning as a hole injecting layer and a hole transport layer. A carrier blocking layer and the like may be inserted as appropriate into the organic EL layer 12 as well.

On the other hand, when the second electrode 13 is the positive electrode, the organic EL layer 12 has the opposite order of layers from that described above.

The organic EL display device 1 according to the present embodiment is a top-emitting display device that emits light outward from the counter substrate 3. In other words, in the organic EL display device 1 according to the present embodiment, the first electrodes 11 are constituted of reflective electrodes, and the second electrode 13 is constituted of a transparent electrode or a translucent electrode. In the organic EL display device 1 according to the present embodiment, light from the light-emitting layer 20W is emitted to the exterior from the counter substrate 3 directly or after being reflected by the first electrodes 11. Additionally, the organic EL display device 1 according to the present embodiment is configured such that any one of Relationships (1) to (5) described later is satisfied and Relationship (6) described later is satisfied. As a result, in the organic EL display device 1 according to the present embodiment, the light emitted from a given sub pixel is prevented from entering into the sub pixels adjacent to that sub pixel, which prevents colors from mixing (details will be given later).

Additionally, the light-emitting layer 20W is configured to emit white light, and in the organic EL display device 1 according to the present embodiment, red light, green light, or blue light is emitted by using a corresponding red color filter 16R, green color filter 16G, and blue color filter 16B provided in the color filter layer 16.

In other words, as illustrated in FIG. 2, in the organic EL display device 1 according to the present embodiment, red, green, and blue sub pixels PR, PG, and PB that emit red light, green light, and blue light, respectively, are provided in a matrix in the pixel area PA (FIG. 1). In the pixel area PA, a set of red, green, and blue sub pixels PR, PG, and PB constitutes a single pixel. Furthermore, as illustrated in FIG. 2, in the pixel area PA, the red, green, and blue sub pixels PR, PG, and PC are segmented by a black matrix 17 provided on the counter substrate 3 on a side closer to the organic EL element 4, in correspondence with the plurality of sub pixels (pixels). In other words, the black matrix 17 is formed on the surface of the counter substrate 3 on the side closer to the organic EL element 4, and the red color filter 16R, the green color filter 16G, and the blue color filter 16B are provided covering the black matrix 17 in correspondence with the plurality of sub pixels (pixels).

In the red sub pixel PR, a part corresponding to a first electrode 11R for a red color exposed from an opening 10R in the edge cover 10 constitutes a substantial light-emitting region of that red sub pixel PR. Likewise, in the green sub pixel PG, a part corresponding to a first electrode 11G for a green color exposed from an opening 10R in the edge cover 10 constitutes a substantial light-emitting region of that green sub pixel PG, and in the blue sub pixel PB, a part corresponding to a first electrode 11B for a blue color exposed from an opening 10R in the edge cover 10 constitutes a substantial light-emitting region of that blue sub pixel PB. In other words, the openings 10R in the edge cover 10 define the light-emitting regions of the sub pixels PR, PG, and PB.

As illustrated in FIG. 2, a first insulating film 9a provided between the foundation film 6 and the edge cover 10, and a second insulating film 9b provided below the RGB first electrodes 11R, 11G, and 11B, are provided in the interlayer insulating film 9 described above.

As described above, in the organic EL display device 1 according to the present embodiment, the organic EL element 4 is sealed by the sealing film 14. The sealing film 14 is configured to prevent moisture, oxygen, and the like from penetrating (permeating) from the exterior, and thus, prevent the organic EL element 4 from degrading.

As described above, the sealing film 14 has the first, second, and third sealing layers 14a, 14b, and 14c. The first, second, and third sealing layers 14a, 14b, and 14c are constituted of an inorganic film such as silicon nitride, silicon oxide, silicon oxynitride, or aluminum oxide, for example.

A film-type filling material having a moisture-absorbing function, for example, is used in the filling layer 15 described above. The filling layer 15 is provided between the sealing film 14 and the color filter layer 16, and serves to improve the adhesion between the sealing film 14 and the color filter layer 16 and increase the sealing properties for the organic EL element 4.

Next, a configuration that prevents color mixing from occurring in the organic EL display device 1 according to the present embodiment will be described in detail with reference to FIG. 3.

Figure 3:
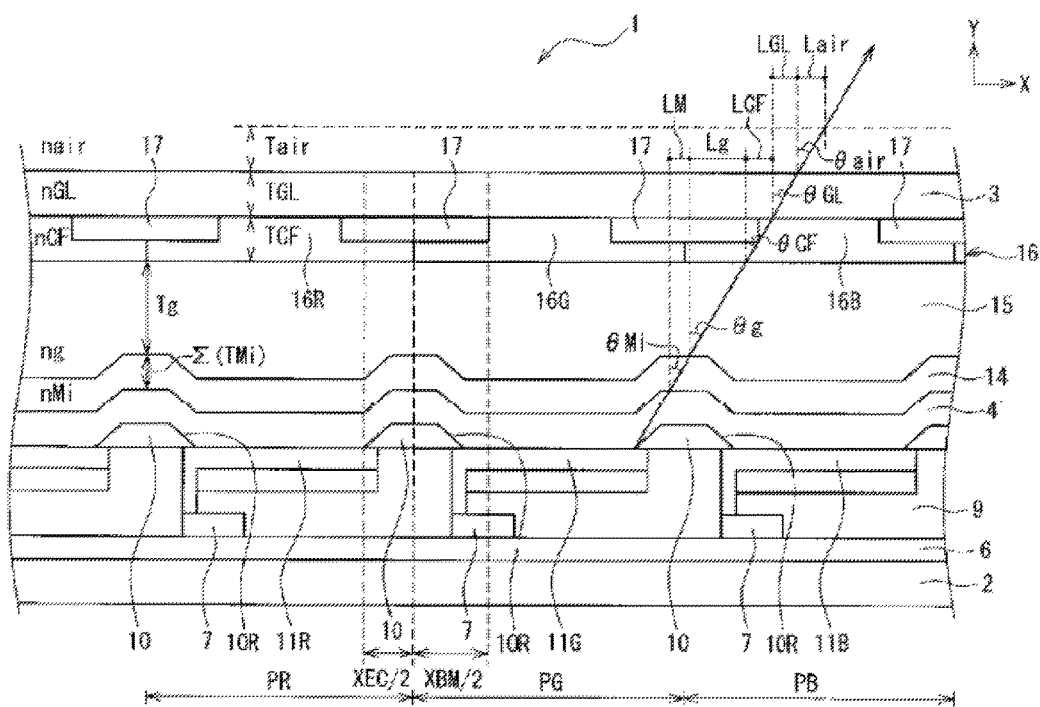
FIG. 3 is a diagram illustrating a configuration preventing color mixing from occurring in the organic EL display device described above.

FIG. 3 is a diagram illustrating a configuration preventing color mixing from occurring in the organic EL display device described above. Note that in FIG. 3, of the constituent elements of the organic EL element 4, the organic EL layer 12 and the second electrode 13 are illustrated collectively as an organic EL element 4'. Additionally, in FIG. 3, the first to third sealing layers 14a to 14c are not illustrated, and are instead indicated by the sealing film 14.

In FIG. 3, a refractive index of an hth (ith) sealing layer from the TFT substrate 2 is represented by nMh (nMi), and a refractive index of the filling layer 15 is represented by ng. Additionally, a refractive index of the color filter layer 16 is represented by nCF, a refractive index of the counter substrate 3 is represented by nGL, and a refractive index of the atmosphere outside the counter substrate 3 is represented by nair.

Additionally, a dimension of the hth (ith) sealing layer in a direction perpendicular to the surface of the TFT substrate 2 (indicated as "Y direction" in FIG. 3) is represented by TMh (TMi), and a dimension of the filling layer 15 in the direction perpendicular to the surface of the TFT substrate 2 is represented by Tg. Furthermore, a dimension of the color filter layer 16 in the direction perpendicular to the surface of the TFT substrate is represented by TCF, a dimension of the counter substrate 3 in the direction perpendicular to the surface of the TFT substrate 2 is represented by TGL, and a dimension that is the same as a dimension of the black matrix 17 in the direction perpendicular to the surface of the TFT substrate 2 is represented by a dimension Tair of the atmosphere in the direction perpendicular to the surface of the TFT substrate.

The dimension Tair (in other words, the film thickness of the black matrix 17) has a specific value within a range of from 1 to 10 µm, for example.

When a refractive index of an (h−1)th sealing layer from the TFT substrate 2 (in other words, the second sealing layer 14b) is represented by nM(h−1), a refractive index of an (h−2)th sealing layer from the TFT substrate 2 (in other words, the first sealing layer 14a) is represented by nM(h−2), an incident angle of light on the (h−1)th sealing layer is represented by θM(h−1), and an incident angle of light on the (h−2)th sealing layer is represented by θM(h−2), a dimension of the (h−1)th sealing layer in a direction parallel to the surface of the substrate, found through the following Equations (a) and (b), is represented by LM(h−1).

$$LM(h-1) = TM(h-1) \times \tan \theta M(h-1) \tag{a}$$

$$\theta M(h-1) = \arcsin\{(nM(h-2)/nM(h-1)) \times \sin \theta M(h-2)\} \tag{b}$$

Additionally, when an incident angle of light on the hth sealing layer (in other words, the third sealing layer 14c) is represented by θMh, a dimension of the hth sealing layer in the direction parallel to the surface of the substrate, found through the following Equations (c) and (d), is represented by LMh.

$$LMh = TMh \times \tan \theta Mh \tag{c}$$

$$\theta Mh = \arcsin\{(nM(h-1)/nMh) \times \sin \theta M(h-1)\} \tag{d}$$

Additionally, when an incident angle of light on the filling layer 15 is represented by θg, a dimension of the filling layer 15 in the direction parallel to the surface of the TFT substrate 2, found through the following Equations (e) and (f), is represented by Lg.

$$Lg = Tg \times \tan \theta g \tag{e}$$

$$\theta g = \arcsin\{(nMh/ng) \times \sin \theta Mh\} \tag{f}$$

Additionally, when an incident angle of light on the color filter layer 16 is represented by θCF, a dimension of the color filter layer 16 in the direction parallel to the surface of the TFT substrate 2, found through the following Equations (g) and (h), is represented by LCF.

$$LCF = TCF \times \tan \theta CF \tag{g}$$

$$\theta CF = \arcsin\{(ng/nCF) \times \sin \theta g\} \tag{h}$$

Additionally, when an incident angle of light on the counter substrate 3 is represented by θGL, a dimension of the counter substrate 3 in the direction parallel to the surface of the TFT substrate 2, found through the following Equations (i) and (j), is represented by LGL.

$$LGL = TGL \times \tan \theta GL \tag{i}$$

$$\theta GL = \arcsin\{(nCF/nGL) \times \sin \theta CF\} \tag{j}$$

Additionally, when an incident angle of light on the atmosphere is represented by θair, a dimension of the atmosphere in the direction parallel to the surface of the TFT substrate 2, found through the following Equations (k) and (l), is represented by Lair.

$$Lair = Tair \times \tan \theta air \quad (k)$$

$$\theta air = \arcsin \{(nGL/nair) \times \sin \theta GL\} \quad (l)$$

The above-described Equations (a) to (l) are derived on the basis of Snell's law, indicated by the following Equation (A). In other words, Snell's law holds true in a multilayer parallel structure including the sealing film 14 having the first to third sealing layers 14a to 14c, the filling layer 15, the color filter layer 16, the counter substrate 3, and the atmosphere.

$$nM1 \sin \theta M1 = \ldots = nMh \sin \theta Mh = ng \sin \theta g = nCF \sin \theta CF = nGL \sin \theta GL = nair \sin \theta air \quad (A)$$

Additionally, total reflection conditions at the hth sealing layer are indicated by the following Relationship (1), in consideration of Equation (a) and (b).

$$nM(h-1)/nMh \times LM(h-1)/\sqrt{(TM(h-1)^2 + LM(h-1)^2)} \geq 1 \quad (1)$$

In other words, when this Relationship (1) is satisfied, light from the light-emitting layer 20W (including light reflected by the first electrodes 11) is totally reflected toward the TFT substrate 2 at the surface of the hth sealing layer on a side closer to the TFT substrate 2. As a result, light from one sub pixel is emitted from the corresponding color filter to the exterior without entering into the adjacent sub pixels.

Additionally, total reflection conditions at the filling layer 15 are indicated by the following Relationship (2), in consideration of Equations (c) and (d).

$$nMh/ng \times LMh/\sqrt{(TMh^2 + LMh^2)} \geq 1 \quad (2)$$

In other words, when this Relationship (2) is satisfied, light from the light-emitting layer 20W (including light reflected by the first electrodes 11) is totally reflected toward the TFT substrate 2 at the surface of the filling layer 15 on a side closer to the TFT substrate 2. As a result, light from one sub pixel is emitted from the corresponding color filter to the exterior without entering into the adjacent sub pixels.

Additionally, total reflection conditions at the color filter layer 16 are indicated by the following Relationship (3), in consideration of Equations (e) and (f).

$$ng/nCF \times Lg/\sqrt{(Tg^2 + Lg^2)} \geq 1 \quad (3)$$

In other words, when this relationship (3) is satisfied, light from the light-emitting layer 20W (including light reflected by the first electrodes 11) is totally reflected toward the TFT substrate 2 at the surface of the color filter layer 16 on a side closer to the TFT substrate 2. As a result, light from one sub pixel is emitted from the corresponding color filter to the exterior without entering into the adjacent sub pixels.

Additionally, total reflection conditions at the counter substrate 3 are indicated by the following Relationship (4), in consideration of Equations (g) and (h).

$$nCF/nGL \times LCF/\sqrt{(TCF^2 + LCF^2)} \geq 1 \quad (4)$$

In other words, when this Relationship (4) is satisfied, light from the light-emitting layer 20W (including light reflected by the first electrodes 11) is totally reflected toward the TFT substrate 2 at the surface of the counter substrate 3 on a side closer to the TFT substrate 2. As a result, light from one sub pixel is emitted from the corresponding color filter to the exterior without entering into the adjacent sub pixels.

Additionally, total reflection conditions at the atmosphere are indicated by the following Relationship (5), in consideration of Equations (i) and (j).

$$nGL/nair \times LGL/\sqrt{(TGL^2 + LGL^2)} \geq 1 \quad (5)$$

In other words, when this Relationship (5) is satisfied, light from the light-emitting layer 20W (including light reflected by the first electrodes 11) is totally reflected toward the TFT substrate 2 at the surface of the counter substrate 3 on a side closer to the atmosphere. As a result, light from one sub pixel is emitted from the corresponding color filter to the exterior without entering into the adjacent sub pixels.

Here, a case where one of the above-described Relationships (1) to (5), for example Relationship (5), is satisfied will be described in detail.

Table 1 indicates an example of the refractive indices of the first to third sealing layers 14a to 14c, the filling layer 15, the color filter layer 16, the counter substrate 3, and the atmosphere.

TABLE 1

|  | | Refractive Index |
|---|---|---|
| First Sealing Layer | nM1 | 1.80 |
| Second Sealing Layer | nM2 | 1.40 |
| Third Sealing Layer | nM3 | 1.80 |
| Filling Layer | ng | 1.50 |
| Color Filter Layer | nCF | 1.60 |
| Counter Substrate | nGL | 1.50 |
| Atmosphere | nair | 1.00 |

Meanwhile, Table 2 indicates an example of the dimensions in the Y direction of the first to third sealing layers 14a to 14c, the filling layer 15, the color filter layer 16, and the counter substrate 3.

TABLE 2

|  | | Y Direction Dimension (μm) |
|---|---|---|
| First Sealing Layer | TM1 | 0.5 |
| Second Sealing Layer | TM2 | 0.5 |
| Third Sealing Layer | TM3 | 0.5 |
| Filling Layer | Tg | 6 |
| Color Filter Layer | TCF | 1 |
| Counter Substrate | TGL | 500 |

Meanwhile, Table 3 indicates an example of the dimensions in an X direction of the first to third sealing layers 14a to 14c, the filling layer 15, the color filter layer 16, and the counter substrate 3.

TABLE 3

|  | | X Direction Dimension (μm) |
|---|---|---|
| First Sealing Layer | LM1 | 0.5 |
| Second Sealing Layer | LM2 | 0.8 |
| Third Sealing Layer | LM3 | 0.3 |
| Filling Layer | Lg | 8 |
| Color Filter Layer | LCF | 0.8 |
| Counter Substrate | LGL | 510 |

Here, when the above-described Relationship (5) is satisfied, or in other words, when the surface of the counter substrate 3 on the side closer to the atmosphere is to totally reflect light, θair may be any value exceeding 90°. Minimum incident angles at the first to third sealing layers 14a to 14c, the filling layer 15, the color filter layer 16, and the counter substrate 3, at which θair becomes a value exceeding 90°, are indicated in Table 4. Note that in Table 4, the minimum incident angles at the second sealing layer 14b, the third sealing layer 14c, the filling layer 15, the color filter layer 16, and the counter substrate 3 are incident angles of light at each layer corresponding to a case where light is incident on the first sealing layer 14a at a minimum incident angle (41.9°). Additionally, the minimum incident angle at the first sealing layer 14a is equal to a minimum light leakage incident angle θlim at which light leaks to adjacent sub pixels (described later).

TABLE 4

|  | Minimum Incident Angle (deg) | |
|---|---|---|
| First Sealing Layer | θM1 | 41.9 |
| Second Sealing Layer | θM2 | 59.2 |
| Third Sealing Layer | θM3 | 31.3 |
| Filling Layer | θg | 53.3 |
| Color Filter Layer | θCF | 38.8 |
| Counter Substrate | θGL | 45.4 |

As indicated in Table 4, light incident on the first sealing layer 14a at an angle greater than or equal to 41.9° satisfies at least the above-described Relationship (5), and is totally reflected at the surface of the counter substrate 3 on the side closer to the atmosphere. As a result, this light does not enter into adjacent sub pixels.

Meanwhile, light incident on the first sealing layer 14a at an angle less than the minimum incident angle (41.9°) (an angle less than the minimum light leakage incident angle θlim) does not enter (leak) into adjacent sub pixels as a result of being incident on an opposing color filler of the color filter layer 16 or incident on the black matrix 17, or in other words, as a result of being blocked by the black matrix 17.

To be more specific, when the dimension of the sealing film 14 in the direction parallel to the surface of the TFT substrate 2 (indicated as the X direction in FIG. 3) is represented by LM, this dimension LM is found through the following Equation (m) using the dimension TMi of the ith (where i is an integer of 1 or greater) sealing layer from the TFT substrate 2 in the direction perpendicular to the surface of the TFT substrate 2 (indicated as the Y in FIG. 3), and an incident angle θMi of light incident on the ith sealing layer.

$$LM = \Sigma(TMi \times \tan \theta Mi) \qquad (m)$$

Additionally, as described above, the dimension Lg of the filling layer 15 in the direction parallel to the surface of the TFT substrate 2 is found through the following Equation (e), and the dimension LCF of the color filter layer 16 in the direction parallel to the surface of the TFT substrate 2 is found through the following Equation (g).

$$Lg = Tg \times \tan \theta g \qquad (e)$$

$$LCF = TCF \times \tan \theta CF \qquad (g)$$

Furthermore, a maximum dimension L at which light leaks into an adjacent sub pixel is found through the following Equation (n).

$$L = LM + Lg + LCF \qquad (n)$$

Light can be prevented from leaking into adjacent sub pixels as long as the maximum dimension L is less than or equal to the sum of ½ a width dimension XBM of the black matrix 17 in the direction parallel to the surface of the TFT substrate 2 and ½ a width dimension XEC of the edge cover 10 in the direction parallel to the surface of the TFT substrate 2.

In other words, by ensuring that the following Relationship (6) is satisfied, light can be prevented from leaking into adjacent sub pixels when light is incident on the first sealing layer 14a at an angle less than the minimum incident angle (an angle less than the minimum light leakage incident angle θlim).

$$XEC/2 + XBM/2 \geq \Sigma(TMi \times \tan \theta Mi) + Tg \times \tan \theta g + TCF \times \tan \theta CF \qquad (6)$$

Meanwhile, the following Equation (o) holds true when the minimum light leakage incident angle at which light leaks into adjacent sub pixels is θlim, for the incident angle of light on the first sealing layer 14a of the sealing layers 14 from the TFT substrate 2.

$$XEC/2 + XBM/2 = TM1 \times \tan \theta lim + TM2 \times \tan \theta M2 + \ldots + TMh \times \tan \theta Mh + Tg \times \tan \theta g \times TCF \times \tan \theta CF \qquad (o)$$

In other words, light incident on the first sealing layer 14a at 0<θM1<θlim does not enter (leak) into adjacent sub pixels as a result of being incident on an opposing color fiber of the color filter layer 16 or incident on the black matrix 17, or in other words, as a result of being blocked by the black matrix 17.

To be more specific, Table 1 indicates the example of the refractive indices of the first to third sealing layers 14a to 14c, the filling layer 15, and the color filter layer 16.

Meanwhile, Table 2 indicates the example of the dimensions in the Y direction of the first to third sealing layers 14a to 14c, the filling layer 15, and the color fiber layer 16.

Additionally, Table 5 indicates an example of the dimensions in the X direction of the first to third sealing layers 14a to 14c, the filling layer 15, and the color fiber layer 16, as well as a value L that is a total thereof.

TABLE 5

|  |  | X Direction Dimension (μm) |
|---|---|---|
| First Sealing Layer | LM1 | 0.5 |
| Second Sealing Layer | LM2 | 0.8 |
| Third Sealing Layer | LM3 | 0.3 |
| Filling Layer | Lg | 8.0 |
| Color Filter Layer | LCF | 0.8 |
| Total | L | 10.4 |

Meanwhile, Table 6 indicates an example of ½ the width dimension XBM of the black matrix 17 and ½ the width dimension XEC of the edge cover 10, as well as the value of a sum thereof (a light-blocking limit).

TABLE 6

|  | X Direction Dimension (μm) |
|---|---|
| XEC/2 | 5.0 |
| XBM/2 | 6.0 |
| Light-Blocking Limit | 11.0 |

In the case of the configuration indicated in Tables 1, 2, 5, and 6, the above-described Relationship (6) is satisfied, and thus, no light leaks when light is incident on the first sealing layer 14a at an angle less than the minimum incident angle (an angle less than the minimum light leakage incident angle θlim).

The organic EL display device 1 according to the present embodiment configured as described above satisfies one of the above-described Relationships (1) to (5), which are conditions for total reflection. Thus, in the organic EL display device 1 according to the present embodiment, when light is incident on the first sealing layer 14a from the TFT substrate (substrate) 2 at an angle greater than or equal to the minimum incident angle, at which the angle of light emitted toward the atmosphere from the counter substrate 3 exceeds a value of 90°, the light emitted from the plurality of pixels in the organic EL element 4 described above is totally reflected toward the substrate at any one of the TFT substrate 2-side surface of the third (hth) sealing layer 14c described above, the TFT substrate 2-side surface of the filling layer 15, the TFT substrate 2-side surface of the color filter layer 16, the TFT substrate 2-side surface of the counter substrate 3, and the atmosphere-side surface of the counter substrate 3. Additionally, when light is incident on the first sealing layer 14a at an angle less than the minimum incident angle described above (that is, at an angle less than the minimum light leakage incident angle at which light leaks into adjacent sub pixels), the above-described Relationship (5) is satisfied, and thus, the incident light is incident only on the corresponding color filter layer 16 or the black matrix 17. Thus, according to the present embodiment, light emitted from a (sub) pixel can be prevented from entering a pixel adjacent to that pixel, and color mixing can be prevented, unlike in the conventional example described above. As a result, according to the present embodiment, unlike the conventional example described above, the organic EL display device 1 can be configured that can prevent a drop in display quality and is thus, highly-reliable even when a sealing film is provided.

Additionally, according to the present embodiment, the first to third sealing layers 14a, 14b, and 14c are constituted of an inorganic film, and thus, the sealing film 14 having a superior sealing function can be formed with ease.

Additionally, according to the present embodiment, a film-type filling material is used in the filling layer 15, and thus, the organic EL display device 1 having a simple structure and low number of components can be configured with ease.

Additionally, according to the present embodiment, the organic EL element 4 includes the white light-emitting layer 20W that emits white light, and thus, the organic EL display device 1 having a simple structure can be configured with ease.

Second Embodiment

Figure 4:
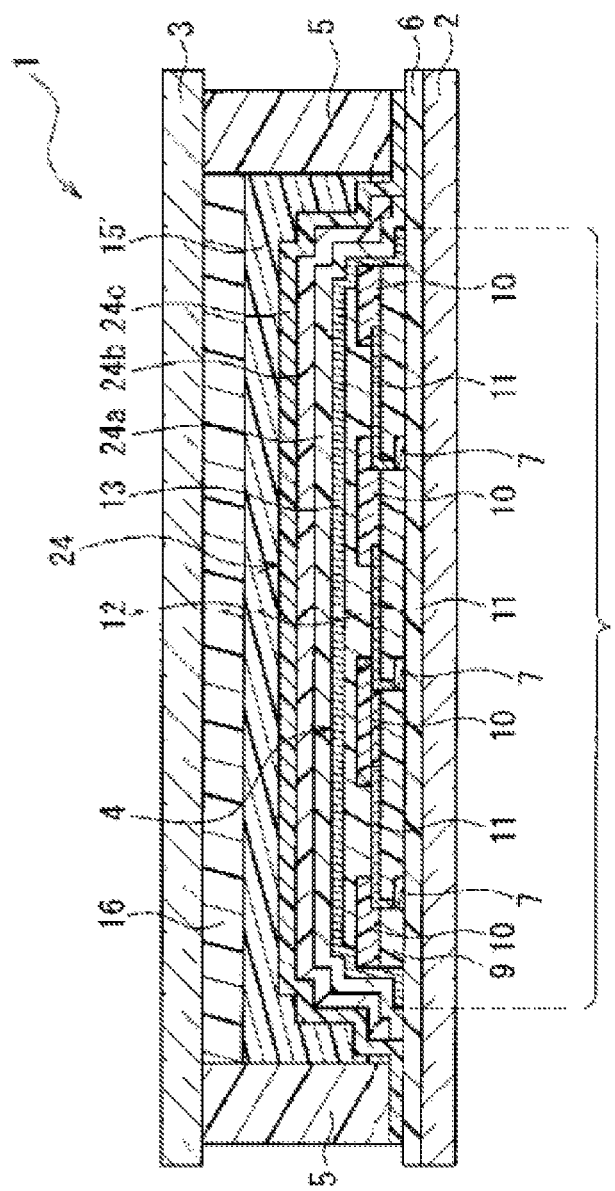
FIG. 4 is a cross-sectional view illustrating a cross-section of an organic EL display device according to a second embodiment of the present invention.
Figure 5:
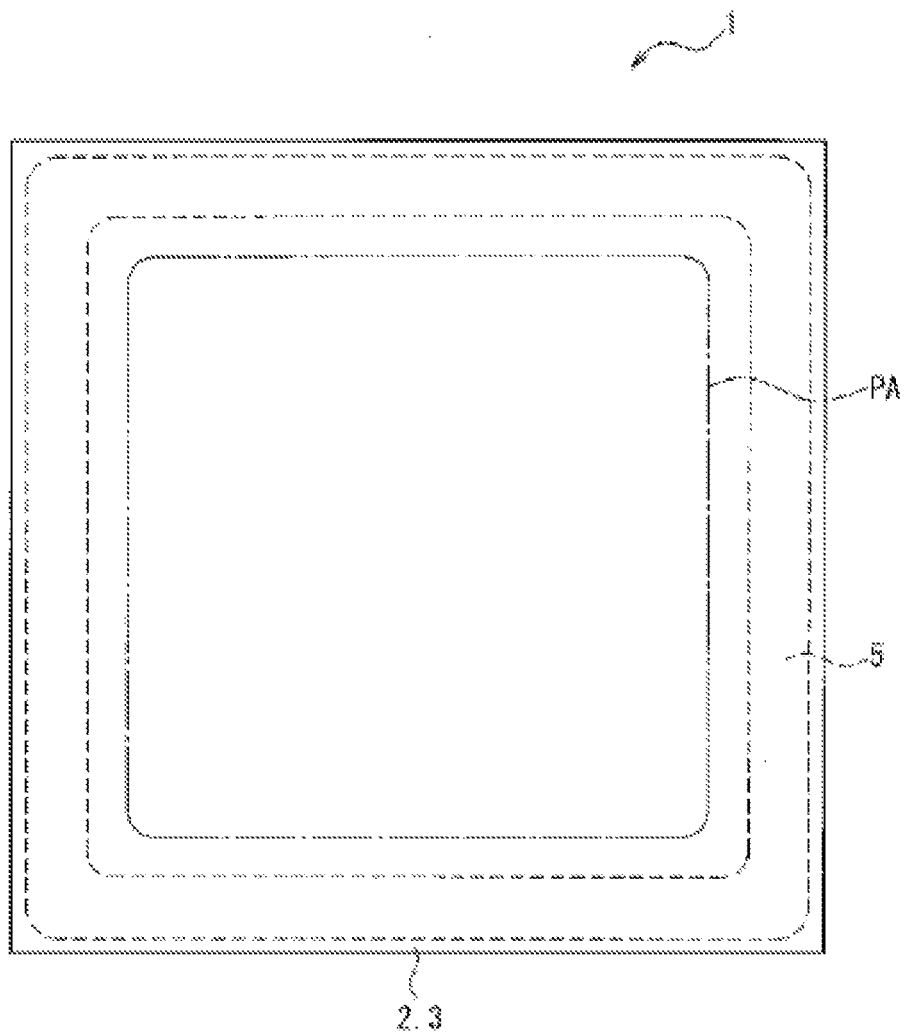
FIG. 5 is a plan view illustrating a plane of the organic EL display device illustrated in FIG. 4.
Figure 6:
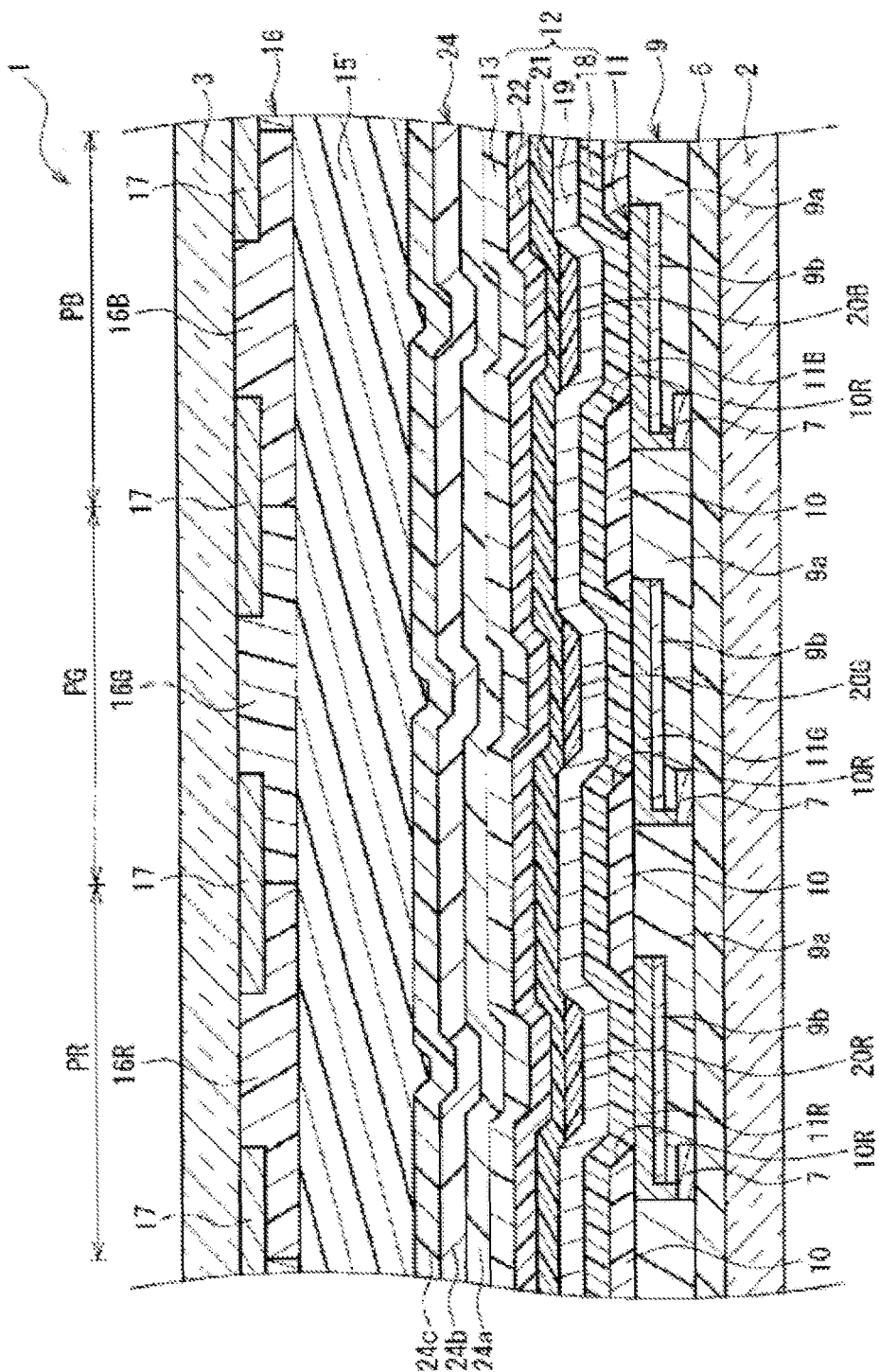
FIG. 6 is an enlarged plan view illustrating a configuration of main parts of the organic EL display device illustrated in FIG. 4.

FIG. 4 is a cross-sectional view illustrating a cross-section of an organic EL display device according to a second embodiment of the present invention. FIG. 5 is a plan view illustrating a plane of the organic EL display device illustrated in FIG. 4. FIG. 6 is an enlarged plan view illustrating the configuration of main parts of the organic EL display device illustrated in FIG. 4.

In the drawings, the main difference between the present embodiment and the first embodiment described above is that light is prevented from leaking by appropriately setting an angle of the openings in the edge cover instead of achieving total reflection as indicated by the above-described Relationships (1) to (5). Elements that are the same as in the first embodiment described above will be assigned the same reference numerals, and redundant descriptions thereof will be omitted.

In other words, as illustrated in FIGS. 4 and 5, in the organic EL display device 1 according to the present embodiment, the organic EL element 4 is sealed by the TFT substrate 2, the counter substrate 3 provided opposing the TFT substrate 2, and a sealing member 5 having a frame shape provided between the TFT substrate 2 and the counter substrate 3.

The sealing member 5 is formed by distributing spacers defining a cell gap between the TFT substrate 2 and the counter substrate 3 along with inorganic particles throughout a resin such as epoxy resin, for example. As illustrated in FIG. 5, the sealing member 5 is formed in a frame shape in the periphery of the pixel area PA. Distributing the inorganic particles through the sealing member 5 makes it possible to further reduce moisture permeability.

Unlike the first embodiment, in the organic EL display device 1 according to the present embodiment, a sealing film 24 having a layered structure including an inorganic film and an organic film is used. To be more specific, a first sealing layer 24a constituted of an inorganic film, a second sealing layer 24b constituted of an organic film, and a third sealing layer 24c constituted of an inorganic film, for example, are provided in the sealing film 24. Silicon nitride, silicon oxide, silicon oxynitride, or aluminum oxide, for example, is used in the inorganic film. Meanwhile, silicon oxycarbide, acrylate, polyurea, Parylene, polyimide, or polyamide, for example, is used in the organic film.

Additionally, in the organic EL display device 1 according to the present embodiment, a filling layer 15' using a liquid filling material is provided. The filling layer 15' is filled between the sealing film 24 and the color filter layer 16, and is sealed by the sealing member 5. A material in which particles having a moisture-absorbing function are distributed throughout a resin, namely a metal oxide such as aluminum hydroxide or calcium oxide, activated carbon, or the like, is used as the filling material for the filling layer 15'.

Meanwhile, as illustrated in FIG. 6, in the organic EL display device 1 according to the present embodiment, light-emitting layers 20R, 20G, and 20B that emit light of corresponding colors are used in each of the R, G, and B sub pixels PR, PG, and PB, unlike in the first embodiment. In other words, the light-emitting layer 20R that emits red light is provided in the red sub pixel PR, and the light from the light-emitting layer 20R is emitted to the exterior through the red color filter 16R. Likewise, the light-emitting layer 20G that emits green light is provided in the green sub pixel PG, and the light from the light-emitting layer 20G is emitted to the exterior through the green color filter 16G. Additionally, the light-emitting layer 20B that emits blue light is provided in the blue sub pixel PB, and the light from the light-emitting layer 20B is emitted to the exterior through the blue color fiber 16B.

Additionally, in the organic EL display device 1 according to the present embodiment, a center of the edge cover 10 in the direction parallel to the surface of the TFT substrate 2 (the left-right direction in FIG. 6) matches a center of the black matrix 17 in the direction parallel to the surface of the TFT substrate 2. Furthermore, in the organic EL display device 1 according to the present embodiment, Relationship (6) described later is satisfied and the angle of the openings 10R in the edge cover 10 are set appropriately. As a result, in the organic EL display device 1 according to the present embodiment, the light emitted from a given sub pixel is prevented from entering into the sub pixels adjacent to that sub pixel, which prevents colors from mixing (details will be given later).

Next, a configuration that prevents color mixing from occurring in the organic EL display device 1 according to the present embodiment will be described in detail with reference to FIG. 7.

Figure 7:
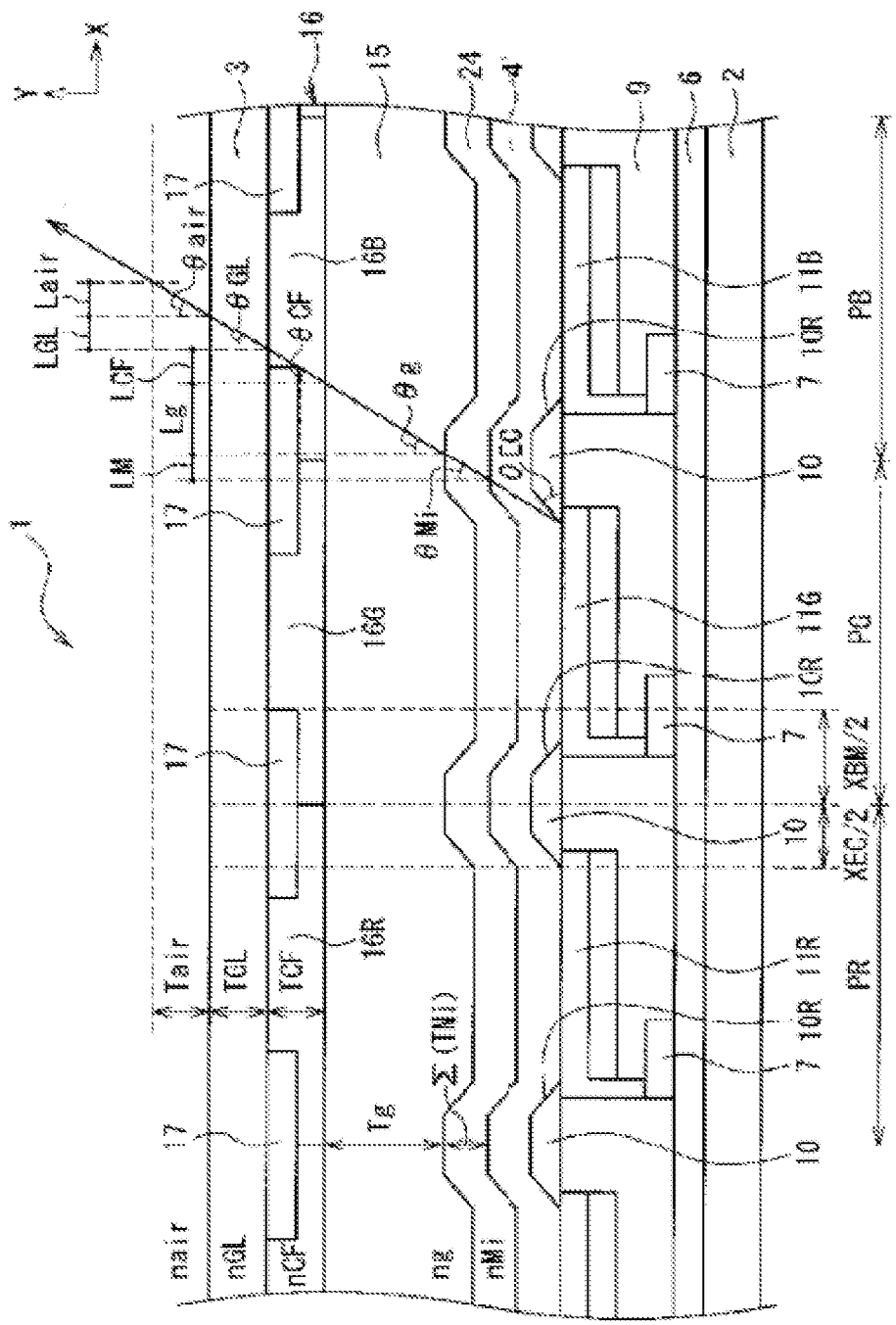
FIG. 7 is a diagram illustrating a configuration preventing color mixing from occurring in the organic EL display device illustrated in FIG. 4.

FIG. 7 is a diagram illustrating a configuration preventing color mixing from occurring in the organic EL display device illustrated in FIG. 4.

With the organic EL display device 1 according to the present embodiment in FIG. 7, Snell's law, indicated by the above-described Equation (A), holds true, in the same manner as in the first embodiment.

Additionally, when the dimension of the sealing film 24 in the direction parallel to the surface of the TFT substrate 2 (indicated as the X direction in FIG. 7) is represented by LM, this dimension LM is found through the following Equation (m) using the dimension TMi of the ith sealing layer from the TFT substrate 2 in the direction perpendicular to the surface of the TFT substrate 2 (indicated as the Y in FIG. 7), and the incident angle θMi of light incident on the ith sealing layer.

$$LM=\Sigma(TMi \times \tan \theta Mi) \quad (m)$$

Additionally, as described above, the dimension Lg of the filling layer 15' in the direction parallel to the surface of the TFT substrate 2 is found through the following Equation (e), and the dimension LCF of the color filter layer 16 in the direction parallel to the surface of the TFT substrate 2 is found through the following Equation (g).

$$Lg=Tg \times \tan \theta g \quad (e)$$

$$LCF=TCF \times \tan \theta CF \quad (g)$$

Furthermore, the maximum dimension L at which light leaks into an adjacent sub pixel is found through the following Equation (n).

$$L=LM+Lg+LCF \quad (n)$$

Light can be prevented from leaking into adjacent sub pixels as long as the maximum dimension L is less than or equal to the sum of ½ the width dimension XBM of the black matrix 17 in the direction parallel to the surface of the TFT substrate 2 and ½ the width dimension XEC of the edge cover 10 in the direction parallel to the surface of the TFT substrate 2.

In other words, by ensuring that the following Relationship (6) is satisfied, light can be prevented from leaking into adjacent sub pixels.

$$XEC/2+XBM/2 \geq \Sigma(TMi \times \tan \theta Mi)+Tg \times \tan \theta g+TCF \times \tan \theta CF \quad (6)$$

Meanwhile, the following Equation (o) holds true when the minimum light leakage incident angle at which light leaks into adjacent sub pixels is θlim, for the incident angle of light on the first sealing layer 24a of the sealing layers 24 from the TFT substrate 2.

$$XEC/2+XBM/2=TM1 \times \tan \theta lim+TM2 \times \tan \theta M2+ \ldots +TMh \times \tan \theta Mh+Tg \times \tan \theta g \times TCF \times \tan \theta CF \quad (o)$$

In other words, light incident on the first sealing layer 24a at 0<θM1<θlim does not enter (leak) into adjacent sub pixels as a result of being incident on an opposing color filter of the color filler layer 16 or incident on the black matrix 17, or in other words, as a result of being blocked by the black matrix 17.

Meanwhile, in the present embodiment, light incident on the first sealing layer 24a at θM1≥θlim is prevented from entering into adjacent sub pixels, or in other words, is prevented from leaking, by appropriately setting an angle θEC at the openings 10R in the edge cover 10.

To be more specific, by forming the edge cover 10 such that the angle θEC at the openings 10R in the edge cover 10 is an angle greater than (90°−θlim), the incident angle of light on the first sealing layer 24a is restricted by the edge cover 10. As a result, light can be reliably prevented from leaking. In other words, light that would be incident on the first sealing layer 24a at an angle greater than or equal to θlim is blocked by the edge cover 10, and thus, is not incident on the first sealing layer 24a, by forming the edge cover 10 such that the angle θEC described above is an angle greater than (90°−θlim).

To be more specific, Table 7 indicates an example of the refractive indices of the first to third sealing layers 24a to 24c, the filling layer 15', and the color filter layer 16.

TABLE 7

|  |  | Refractive Index |
| --- | --- | --- |
| First Sealing Layer | nM1 | 1.80 |
| Second Sealing Layer | nM2 | 1.40 |
| Third Sealing Layer | nM3 | 1.80 |
| Filling Layer | ng | 1.50 |
| Color Filter Layer | nCF | 1.60 |

Meanwhile, Table 8 indicates an example of the dimensions in the Y direction of the first to third sealing layers 24a to 24c, the filling layer 15', and the color filter layer 16.

TABLE 8

|  |  | Y Direction Dimension (μm) |
| --- | --- | --- |
| First Sealing Layer | TM1 | 0.5 |
| Second Sealing Layer | TM2 | 0.5 |
| Third Sealing Layer | TM3 | 0.5 |
| Filling Layer | Tg | 6 |
| Color Filter Layer | TCF | 1 |

Additionally, Table 9 indicates an example of the dimensions in the X direction of the first to third sealing layers 24a to 24c, the filling layer 15', and the color filter layer 16, as well as a value L that is a total thereof.

TABLE 9

|  |  | X Direction Dimension (μm) |
| --- | --- | --- |
| First Sealing Layer | LM1 | 0.5 |
| Second Sealing Layer | LM2 | 0.8 |
| Third Sealing Layer | LM3 | 0.3 |
| Filling Layer | Lg | 8.0 |
| Color Filter Layer | LCF | 0.8 |
| Total | L | 10.4 |

Meanwhile, Table 10 indicates an example of ½ the width dimension XBM of the black matrix 17 and ½ the width dimension XEC of the edge cover 10, as well as the value of a sum thereof (a light-blocking limit).

TABLE 10

|  | X Direction Dimension (μm) |
| --- | --- |
| XEC/2 | 5.0 |
| XBM/2 | 6.0 |
| Light-Blocking Limit | 11.0 |

In the case of the configuration indicated in Tables 7 to 10, the above-described Relationship (6) is satisfied, and thus, no light leaks when light is incident on the first sealing layer 14a at an angle less than the minimum incident angle (an angle less than the minimum light leakage incident angle θlim). Additionally, in this case, the value of the minimum light leakage incident angle θlim is 41.9°, as indicated in Table 4. Accordingly, by setting the angle θEC at the openings 10R in the edge cover 10 to be greater than 48.1° (that is, 90°−41.9°), the incident angle of light on the first sealing layer 24a is restricted by the edge cover 10. As a result, light can be reliably prevented from leaking.

Additionally, by increasing the angle θEC at the openings 10R, at least one of the width dimension XEC of the edge cover 10 and the width dimension XBM of the black matrix 17 can be reduced. In other words, because reducing the minimum light leakage incident angle θlim increases the angle θEC, the value of the left side of the above-described Equation (o), or in other words, of at least one of the width dimension XEC of the edge cover 10 and the width dimension XBM of the black matrix 17, can be reduced when the minimum light leakage incident angle θlim is reduced.

In the organic EL display device 1 according to the present embodiment configured as described above, when light is incident on the first sealing layer 24a from the TFT substrate 2 at an angle less than the minimum incident angle (that is, at an angle less than the minimum light leakage incident angle at which light leaks into adjacent sub pixels), such that the angle of light emitted toward the atmosphere from the counter substrate 3 is a value exceeding 90°, the above-described Relationship (6) is satisfied, and thus, the incident light is incident only on the corresponding color filter layer 16 or the black matrix 17. Additionally, the angle θEC at the openings 10R in the edge cover 10 is set to an angle greater than (90°−θlim), and thus, light is prevented from being incident on the first sealing layer 24a at an angle greater than or equal to the minimum incident angle described above. Thus, according to the present embodiment, light emitted from a (sub) pixel can be prevented from entering a pixel adjacent to that pixel, and color mixing can be prevented, unlike in the conventional example described above. As a result, unlike the conventional example described above, an organic EL display device can be configured that can prevent a drop in display quality and is thus, highly-reliable even when a sealing film is provided. Additionally, the angle θEC described above is set to an angle greater than (90°−θlim), and thus, at least one of the width dimension XBM of the black matrix 17 and the width dimension XEC of the edge cover 10 can be reduced. As a result, according to the present embodiment, the pixel aperture ratio can be increased.

Additionally, according to the present embodiment, the sealing film 24 has a layered structure including an inorganic film and an organic film, and thus, a low-stress structure suitable for achieving flexibility can be provided while ensuring a superior sealing function.

Additionally, according to the present embodiment, a liquid filling material is used for the filling layer 15', and the sealing member 5 having a frame shape is provided between the TFT substrate 2 and the counter substrate 3 and surround the black matrix 17, the color filter layer 16, the filling layer 15', the sealing film 24, and the organic EL element 4. Accordingly, the sealing properties for the organic EL element 4 can be unproved with ease, and the organic EL display device 1 having superior reliability can be configured with ease.

Additionally, according to the present embodiment, the organic EL element 4 includes the red, green, and blue light-emitting layers 20R, 20G, and 20B that emit red, green, and blue light, respectively. Accordingly, the organic EL display device 1 having superior display quality can be configured with ease.

Note that the embodiments described above are simply examples and in no way limit the present invention. The technical scope of the present invention is defined by the claims, and all modifications equivalent in scope to the configurations described therein are also included in the technical scope of the present invention.

For example, although the foregoing describes a case where the present invention is applied in an organic EL display device having an organic EL element, the present invention is not limited thereto, and can also be applied in, for example, an inorganic EL display device having an inorganic EL element.

Additionally, although the foregoing describes a case where the present invention is applied in an active matrix organic EL display device having thin film transistors (TFT) 7, the present invention is not limited thereto, and can also be applied in a passive matrix organic EL display device in which thin film transistors are not provided.

Additionally, the first embodiment described above describes a case where a sealing film having first to third sealing layers constituted of inorganic films is used, and the second embodiment described above describes a case where a sealing film having first to third sealing layers constituted of an inorganic film, an organic film, and an inorganic film, respectively, is used. However, the sealing film according to the present invention may be any sealing film having h (where h is an integer of 3 or greater) sealing layers, and the sealing film may be constituted of a single inorganic film structure, or a layered structure having four or greater layers that are a combination of inorganic films and organic films.

However, aside from these, the present invention can also be applied in a device including a sealing film having one or two sealing layers.

To be more specific, when a sealing film having h (where h is an integer of 1 or greater) sealing layers is used, the configuration may be such that light emitted from the plurality of pixels in the organic EL element described above is totally reflected toward the substrate at any one of the substrate-side surface of the color filter layer, the substrate-side surface of the counter substrate, and the atmosphere-side surface of the counter substrate, by ensuring that any one of the following Relationships (3) to (5) is satisfied and that the following Relationship (6) is satisfied.

In other words, the organic EL display device according to the present invention may include:

a substrate;

an organic EL element provided on the substrate, the organic EL element including a plurality of pixels, the organic EL element including:

a first electrode, the first electrode being provided for each of the plurality of pixels and constituted of a reflective electrode; and an edge cover including an opening, the opening being provided exposing the first electrode and defining a light-emitting region of each of the plurality of pixels;

a sealing film including h, where h is an integer or 1 or greater, sealing layers layered with each other, the sealing film sealing the organic EL element;

a counter substrate opposing the substrate;

a black matrix provided on the counter substrate on a side closer to the organic EL element, the black matrix corresponding to the plurality of pixels;

a color filter layer provided covering the black matrix, the color filter layer corresponding to the plurality of pixels; and a filling layer filled between the sealing film and the color filter layer, wherein when a refractive index of an hth sealing layer from the substrate is represented by nMh, a refractive index of the filling layer is represented by ng, a refractive index of the color filter layer is represented by nCF, and a refractive index of the counter substrate is represented by nGL.

a dimension of the filling layer in a direction perpendicular to a surface of the substrate is represented by Tg, a dimension of the color filter layer in the direction perpendicular to the surface of the substrate is represented by TCF, and a dimension of the counter substrate in the direction perpendicular to the surface of the substrate is represented by TGL, an incident angle of light on the hth sealing layer is represented by θMh and an incident angle of light on the filling layer is represented by θg, a dimension of the filling layer in a direction parallel to the surface of the substrate is represented by Lg, Lg being found through the following Equations (e) and (f), $$Lg = Tg \times \tan \theta g \quad (e)$$

$$\theta g = \arcsin\{(nMh/ng) \times \sin \theta Mh\} \quad (f),$$

when an incident angle of light on the color filter layer is represented by θCF, a dimension of the color filter layer in the direction parallel to the surface of the substrate is represented by LCF, LCF being found through the following Equations (g) and (h), $$LCF = TCF \times \tan \theta CF \quad (g)$$

$$\theta CF = \arcsin\{(ng/nCF) \times \sin \theta g\} \quad (h),$$

when an incident angle of light on the counter substrate is represented by θGL, a dimension of the counter substrate in the direction parallel to the surface of the substrate is represented by LGL, LGL being found through the following Equations (i) and (j), $$LGL = TGL \times \tan \theta GL \quad (i)$$

$$\theta GL = \arcsin\{(nCF/nGL) \times \sin \theta CF\} \quad (j),$$

any one of the following Relationships (3) to (5), the relationships being conditions for total reflection, may be satisfied, $$ng/nCF \times Lg/\sqrt{(Tg^2 + Lg^2)} \geq 1 \quad (3)$$

$$nCF/nGL \times LCF/\sqrt{(TCF^2 + LCF^2)} \geq 1 \quad (4)$$

$$nGL/nair \times LGL/\sqrt{(TGL^2 + LGL^2)} \geq 1 \quad (5),$$

the black matrix and the edge cover are provided with a center of the black matrix and a center of the edge cover matching each other in the direction parallel to the surface of the substrate, and when a width dimension of the black matrix in the direction parallel to the surface of the substrate is represented by XBM and a width dimension of the edge cover in the direction parallel to the surface of the substrate is represented by XEC, a dimension, in the direction perpendicular to the surface of the substrate, of an ith, where i is an integer of 1 or greater, sealing layer, among the h sealing layers, from the substrate, is represented by TMi, and an incident angle of light on the ith sealing layer is represented by θMi, the following Relationship (6) may be satisfied, $$XEC/2 + XBM/2 \geq \Sigma(TMi \times \tan \theta Mi) + Tg \times \tan \theta g + TCF \times \tan \theta CF \quad (6).$$

Furthermore, in addition to the foregoing, the first and second embodiments described above may be combined as appropriate.

INDUSTRIAL APPLICABILITY

The present invention is useful in an organic EL display device that can prevent a drop in display quality and is thus, highly-reliable even when a sealing film is provided.

REFERENCE SIGNS LIST

1 Organic EL display device
2 TFT substrate (substrate)
3 Counter substrate
4 Organic EL element (electroluminescence element)
5 Sealing member
10 Edge cover
10R Opening
11 First electrode (reflective electrode)
14 Sealing film
14a First sealing layer (inorganic film)
14b Second sealing layer (inorganic film)
14c Third sealing layer (inorganic film)
15, 15' Filling layer
16 Color fiber layer
17 Black matrix
20W White light-emitting layer
20R Red light-emitting layer
20G Green light-emitting layer
20B Blue light-emitting layer
24 Sealing film
24a First sealing layer (inorganic film)
24b Second sealing layer (organic film)
24c Third sealing layer (inorganic film)
PR, PG, PB Pixel

The invention claimed is:

1. An organic EL display device comprising:
a substrate;
an organic EL element provided on the substrate, the organic EL element including a plurality of pixels, the organic EL element including:
a first electrode, the first electrode being provided for each of the plurality of pixels and constituted of a reflective electrode; and
an edge cover including an opening, the opening being provided exposing the first electrode and defining a light-emitting region of each of the plurality of pixels;
a sealing film including h, where h is an integer of 3 or greater, scaling layers layered with each other, the sealing film sealing the organic EL element;
a counter substrate opposing the substrate;
a black matrix provided on the counter substrate on a side closer to the organic EL element, the black matrix corresponding to the plurality of pixels;
a color filter layer provided covering the black matrix, the color filter layer corresponding to the plurality of pixels; and
a filling layer filled between the sealing film and the color filter layer,
wherein when a refractive index of an hth sealing layer from the substrate represented by nMh, a refractive index of the filling layer is represented by ng, a refractive index of the color filter layer is represented by nCF, and a refractive index of the counter substrate is represented by nOL, a dimension of the hth sealing layer in a direction perpendicular to a surface of the substrate is represented by TMh, a dimension of an (h−1)th sealing layer from the substrate in the direction perpendicular to the surface of the substrate is represented by TM(h−1), a dimension of the filling layer in the direction perpendicular to the surface of the substrate is represented by Tg, a dimension of the color filter layer in the direction perpendicular to the surface of the substrate is represented by TCF, and a dimension of the counter substrate in the direction perpendicular to the surface of the substrate is represented by TGL, and a refractive index of the (h−1)th sealing layer is represented by nM(h−1), a refractive index of an (h−2)th sealing layer from the substrate is represented by nM(h−2), an incident angle of light on the (h−1)th sealing layer is represented by θM(h−1), and an incident angle of light on the (h−2)th sealing layer is represented by θM(h−2), a dimension of the (h−1)th sealing layer in a direction parallel to the surface of the substrate is represented by LM(h−1), LM(h−1) being found through Equations (a) and (b):

$$LM(h-1)=TM(h-1)\times\tan\theta M(h-1) \tag{a}$$

$$\theta M(h-1)=\arcsin\{(nM(h-2)/nM(h-1))\times\sin\theta M(h-2)\} \tag{b},$$

when an incident angle of light on the hth sealing layer is represented by θMh, a dimension of the hth sealing layer in the direction parallel to the surface of the substrate is represented by LMh, LMh being found through the Equations (c) and (d):

$$LMh=TMh\times\tan\theta Mh \tag{c}$$

$$\theta Mh=\arcsin\{(nM(h-1)/nMh)\times\sin\theta M(h-1)\} \tag{d},$$

when an incident angle of light on the filling layer is represented by θg, a dimension of the filling layer in the direction parallel to the surface of the substrate is represented by Lg, Lg being found through Equations (e) and (f):

$$Lg=Tg\times\tan\theta g \tag{e}$$

$$\theta g=\arcsin\{(nMh/ng)\times\sin\theta Mh\} \tag{f},$$

when an incident angle of light on the color filter layer is represented by θCF, a dimension of the color filter layer in the direction parallel to the surface of the substrate is represented by LCF, LCF being found through Equations (g) and (h):

$$LCF=TCF\times\tan\theta CF \tag{g}$$

$$\theta CF=\arcsin\{(ng/nCF)\times\sin\theta g\} \tag{h},$$

when an incident angle of light on the counter substrate is represented by θGL, a dimension of the counter substrate in the direction parallel to the surface of the substrate is represented by LGL, LGL being found through Equations (i) and (j):

$$LGL=TGL\times\tan\theta GL \tag{i}$$

$$\theta GL=\arcsin\{(nCF/nGL)\times\sin\theta CF\} \tag{j},$$

any one of Relationships (1) to (5), the relationships being conditions for total reflection, are satisfied:

$$nM(h-1)/nMh\times LM(h-1)/\sqrt{(TM(h-1)^2+LM(h-1)^2)}\geq 1 \tag{1}$$

$$nMh/ng\times LMh/\sqrt{(TMh^2+LMh^2)}\geq 1 \tag{2}$$

$$ng/nCF\times Lg/\sqrt{(Tg^2+Lg^2)}\geq 1 \tag{3}$$

$$nCF/nGL\times LCF/\sqrt{(TCF^2+LCF^2)}\geq 1 \tag{4}$$

$$nGL/nair\times LGL/\sqrt{(TGL^2+LGL^2)}\geq 1 \tag{5},$$

the black matrix and the edge cover are provided with a center of the black matrix and a center of the edge cover matching each other in the direction parallel to the surface of the substrate, and when a width dimension of the black matrix in the direction parallel to the surface of the substrate is represented by XBM and a width dimension of the edge cover in the direction parallel to the surface of the substrate is represented by XEC, a dimension, in the direction perpendicular to the surface of the substrate, of an ith, where i is an integer of 1 or greater, sealing layer, among the h sealing layers, from the substrate, is represented by TMi, and an incident angle of light on the ith sealing layer is represented by θMi, Relationship (6) is satisfied:

$$XEC/2+XBM/2\geq\Sigma(TMi\times\tan\theta Mi)+Tg\times\tan\theta g+TCF\times\tan\theta CF \tag{6}.$$

2. An organic EL display device comprising:
a substrate;
an organic EL element provided on the substrate, the organic EL element including a plurality of pixels, the organic EL element including:
  a first electrode, the first electrode being provided for each of the plurality of pixels and constituted of a reflective electrode; and
  an edge cover including an opening, the opening being provided exposing the first electrode and defining a light-emitting region of each of the plurality of pixels;
a sealing film including h, where h is an integer or 1 or greater, sealing layers layered with each other, the sealing film sealing the organic EL element;
a counter substrate opposing the substrate;
a black matrix provided on the counter substrate on a side closer to the organic EL element, the black matrix corresponding to the plurality of pixels;
a color filter layer provided covering the black matrix, the color filter layer corresponding to the plurality of pixels; and
a filling layer filled between the sealing film and the color filter layer,
wherein when a refractive index of an hth sealing layer from the substrate represented by nMh, a refractive index of the filling layer is represented by ng, a refractive index of the color filter layer is represented by nCF, and a refractive index of the counter substrate is represented by nGL,
a dimension of the filling layer in a direction perpendicular to a surface of the substrate is represented by Tg, a dimension of the color filter layer in the direction perpendicular to the surface of the substrate is represented by TCF, and a dimension of the counter substrate in the direction perpendicular to the surface of the substrate is represented by TGL, and
an incident angle of light on the hth sealing layer is represented by θMh and an incident angle of light on the filling layer is represented by θg,
a dimension of the filling layer in a direction parallel to the surface of the substrate is represented by Lg, Lg being found through Equations (e) and (f), $$Lg=Tg\times\tan\theta g \tag{e}$$

$$\theta g=\arcsin\{(nMh/ng)\times\sin\theta Mh\} \tag{f},$$

when an incident angle of light on the color filter layer is represented by θCF, a dimension of the color filter layer in the direction parallel to the surface of the substrate is represented by LCF, LCF being found through Equations (g) and (h), $$LCF = TCF \times \tan \theta CF \quad (g)$$

$$\theta CF = \arcsin\{(ng/nCF) \times \sin \theta g\} \quad (h),$$

when an incident angle of light on the counter substrate is represented by θGL, a dimension of the counter substrate in the direction parallel to the surface of the substrate is represented by LGL, LGL being found through Equations (i) and (j), $$LGL = TGL \times \tan \theta GL \quad (i)$$

$$\theta GL = \arcsin\{(nCF/nGL) \times \sin \theta CF\} \quad (j),$$

any one of Relationships (3) to (5), the relationships being conditions for total reflection, are satisfied, $$ng/nCF \times Lg/\sqrt{(Tg^2 + Lg^2)} \geq 1 \quad (3)$$

$$nCF/nGL \times LCF/\sqrt{(TCF^2 + LCF^2)} \geq 1 \quad (4)$$

$$nGL/nair \times LGL/\sqrt{(TGL^2 + LGL^2)} \geq 1 \quad (5),$$

the black matrix and the edge cover are provided with a center of the black matrix and a center of the edge cover matching each other in the direction parallel to the surface of the substrate, and when a width dimension of the black matrix in the direction parallel to the surface of the substrate is represented by XBM and a width dimension of the edge cover in the direction parallel to the surface of the substrate is represented by XEC, a dimension, in the direction perpendicular to the surface of the substrate, of an ith, where i is an integer of 1 or greater, sealing layer, among the h sealing layers, from the substrate, is represented by TMi, and an incident angle of light on the ith scaling layer is represented by θMi, Relationship (6) is satisfied:

$$XEC/2 + XBM/2 \geq \Sigma(TMi \times \tan \theta Mi) + Tg \times \tan \theta g + TCF \times \tan \theta CF \quad (6).$$

3. An organic EL display device comprising:
a substrate;
an organic EL element provided on the substrate, the organic EL element including a plurality of pixels, the organic EL element including:
  a first electrode, the first electrode being provided for each of the plurality of pixels and constituted of a reflective electrode; and
  an edge cover including an opening, the opening being provided exposing the first electrode and defining a light-emitting region of each of the plurality of pixels;
a sealing film including h, where h is an integer of 1 or greater, sealing layers layered with each other, the sealing film sealing the organic EL element;
a counter substrate opposing the substrate;
a black matrix provided on the counter substrate on a side closer to the organic EL element, the black matrix corresponding to the plurality of pixels;
a color filter layer provided covering the black matrix, the color filter layer corresponding to the plurality of pixels; and
a filling layer filled between the sealing film and the color filter layer, wherein when a refractive index of an hth sealing layer from the substrate is represented by nMh, a refractive index of the filling layer is represented by ng, and a refractive index of the color filter layer is represented by nCF,
a dimension of the filling layer in a direction perpendicular to a surface of the substrate is represented by Tg, and a dimension of the color filter layer in the direction perpendicular to the surface of the substrate is represented by TCF, and
an incident angle of light on the hth sealing layer is represented by θMh and an incident angle of light on the filling layer is represented by θg,
a dimension of the filling layer in a direction parallel to the surface of the substrate is represented by Lg, Lg being found through Equations (e) and (f), $$Lg = Tg \times \tan \theta g \quad (e)$$

$$\theta g = \arcsin\{(nMh/ng) \times \sin \theta Mh\} \quad (f),$$

when an incident angle of light on the color filter layer is represented by θCF, a dimension of the color filter layer in the direction parallel to the surface of the substrate is represented by LCF, LCF being found through Equations (g) and (h), $$LCF = TCF \times \tan \theta CF \quad (g)$$

$$\theta CF = \arcsin\{(ng/nCF) \times \sin \theta g\} \quad (h),$$

the black matrix and the edge cover are provided with a center of the black matrix and a center of the edge cover matching each other in the direction parallel to the surface of the substrate,
when a width dimension of the black matrix in the direction parallel to the surface of the substrate is represented by XBM and a width dimension of the edge cover in the direction parallel to the surface of the substrate is represented by XEC, a dimension, in the direction perpendicular to the surface of the substrate, of an ith, where i is an integer of 1 or greater, sealing layer, among the h sealing layers, from the substrate, is represented by TMi, and an incident angle of light on the ith sealing layer is represented by θMi,
Relationship (6) is satisfied:

$$XEC/2 + XBM/2 \geq \Sigma(TMi \times \tan \theta Mi) + Tg \times \tan \theta g + TCF \times \tan \theta CF \quad (6),$$

when, at the incident angle of light from the substrate incident on the first sealing layer of the h sealing layers, a minimum light leakage incident angle at which light leaks to an adjacent sub pixel is represented by θlim, Equation (o) holds true, $$XEC/2 + XBM/2 = TM1 \times \tan \theta lim + TM2 \times \tan \theta M2 + \ldots + TMh \times \tan \theta Mh + Tg \times \tan \theta g \times TCF \times \tan \theta CF \quad (o),$$

and
when an angle of the opening in the edge cover is represented by θEC, the angle θEC is set to an angle greater than (90°−θlim).

4. The organic EL display device according to claim 3, wherein the h sealing layers are constituted of h inorganic films.

5. The organic EL display device according to claim 3, wherein the h sealing layers are constituted of a layered structure of an inorganic film and an organic film.

6. The organic EL display device according to claim 3, wherein a film-type filling material is used in the filling layer.

7. The organic EL display device according to claim 3, wherein a liquid fitting material is used in the filling layer; and a sealing member having a frame shape is provided between the substrate and the counter substrate and surrounds the black matrix, the color filter layer, the filling layer, the sealing film, and the organic EL element.

8. The organic EL display device according to claim 3, wherein the organic EL element includes a white light-emitting layer that emits white light.

9. The organic EL display device according to claim 3, wherein the organic EL element includes red, green, and blue light-emitting layers that emit red, green, and blue light, respectively.

10. The organic EL display device according to claim 1, wherein the h sealing layers are constituted of, in sequence from the substrate, a first inorganic film, an organic film, a second inorganic film, and wherein an edge of the inorganic film is in touch with the first inorganic film and the second inorganic film.

11. The organic EL display device according to claim 2, wherein the h sealing layers are constituted of, in sequence from the substrate, a first inorganic film, an organic film, a second inorganic film, and wherein an edge of the inorganic film is in touch with the first inorganic film and the second inorganic film.

12. The organic EL display device according to claim 3, wherein the h sealing layers are constituted of, in sequence from the substrate, a first inorganic film, an organic film, a second inorganic film, and wherein an edge of the inorganic film is in touch with the first inorganic film and the second inorganic film.

\* \* \* \* \*